United States Patent
Brantingham et al.

(10) Patent No.: US 11,740,953 B2
(45) Date of Patent: Aug. 29, 2023

(54) SOLDER JOINT DAMAGE-PREVENTION MODE FOR A COMPUTING DEVICE

(71) Applicant: Google LLC, Mountain View, CA (US)

(72) Inventors: Luke Manuel Brantingham, Chicago, IL (US); Kavinaath Murugan, Chicago, IL (US); Yun Sun Lee, Buffalo Grove, IL (US); Aaditya Kandibanda, Aurora, IL (US)

(73) Assignee: Google LLC, Mountain View, CA (US)

( * ) Notice: Subject to any disclaimer, the term of this patent is extended or adjusted under 35 U.S.C. 154(b) by 123 days.

(21) Appl. No.: 17/316,376

(22) Filed: May 10, 2021

(65) Prior Publication Data

US 2022/0237059 A1 Jul. 28, 2022

Related U.S. Application Data

(60) Provisional application No. 63/140,468, filed on Jan. 22, 2021.

(51) Int. Cl.
| | |
|---|---|
| *G06F 11/00* | (2006.01) |
| *G06F 1/20* | (2006.01) |
| *G06F 1/3206* | (2019.01) |
| *G06F 9/48* | (2006.01) |
| *G01R 31/28* | (2006.01) |
| *G01R 31/71* | (2020.01) |

(52) U.S. Cl.
CPC ........ *G06F 11/008* (2013.01); *G01R 31/2817* (2013.01); *G01R 31/71* (2020.01)

(58) Field of Classification Search
CPC ..................................................... G06F 1/04
See application file for complete search history.

(56) References Cited

U.S. PATENT DOCUMENTS

| | | | |
|---|---|---|---|
| 8,290,753 B2 | 10/2012 | Tryon et al. | |
| 8,521,443 B2 | 8/2013 | Vichare et al. | |
| 8,751,212 B2 | 6/2014 | Inoue | |
| 10,275,001 B2 | 4/2019 | Kam et al. | |
| 2018/0345395 A1 | 12/2018 | Snugovsky et al. | |
| 2019/0043559 A1* | 2/2019 | McVay | G06F 3/0634 |

OTHER PUBLICATIONS

George, et al., "Thermal Cycling Reliability of Lead-Free Solders (SAC305 and SN3.5AG) for High Temperature Applications", Thesis submitted to the Faculty of the Graduate School of the University of Maryland, College Park, in partial fulfillment of the requirements for the degree of Master of Science, 2010, 78 pages.

* cited by examiner

*Primary Examiner* — Jermele M Hollington
(74) *Attorney, Agent, or Firm* — Colby Nipper PLLC

(57) ABSTRACT

This document describes techniques and apparatuses including a solder joint damage-prevention mode for a computing device. In general, the computing device may enter the solder joint damage-prevention mode to transfer heat to solder joints and prevent failure mechanisms such as fracture, creep, and/or fatigue. The solder joint damage-prevention mode may rely upon one or more operations, including identifying a state of the computing device in or following which damage to the solder joints has an increased likelihood and, in response, activating a thermal-conditioning system. The thermal-conditioning system may, in general, increase a temperature of the solder joints to improve mechanical robustness of the solder joints.

13 Claims, 3 Drawing Sheets

SOLDER JOINT DAMAGE-PREVENTION MODE FOR A COMPUTING DEVICE

CROSS-REFERENCE TO RELATED MATTER

This application claims priority to U.S. Provisional Application Ser. No. 63/140,468, filed Jan. 22, 2021, the disclosure of which is hereby incorporated by reference.

SUMMARY

This document describes techniques and apparatuses including a solder joint damage-prevention mode for a computing device. In general, the computing device may enter the solder joint damage-prevention mode to transfer heat to solder joints and prevent failure mechanisms such as fracture, creep, and/or fatigue. The solder joint damage-prevention mode may rely upon one or more operations, including identifying a state of the computing device in or following which damage to the solder joints has an increased likelihood and, in response, activating a thermal-conditioning system. The thermal-conditioning system may, in general, increase a temperature of the solder joints to improve mechanical robustness of the solder joints.

This Summary is provided to introduce simplified concepts of techniques and apparatuses drawn to a solder joint damage-prevention mode, the concepts of which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of techniques and apparatuses including a solder joint damage-prevention mode for a computing device are described in this document with reference to the following drawings. The same numbers are used throughout the drawings to reference like features and components.

DETAILED DESCRIPTION

This document describes techniques and apparatuses including a solder joint damage-prevention mode for a computing device. In general, the computing device may enter the solder joint damage-prevention mode to transfer heat to solder joints and prevent failure mechanisms such as fracture, creep, and/or fatigue. The solder joint damage-prevention mode may rely upon one or more operations, including identifying a state of the computing device in or following which damage to the solder joints has an increased likelihood and, in response, activating a thermal-conditioning system. The thermal-conditioning system may, in general, increase a temperature of the solder joints to improve mechanical robustness of the solder joints.

The techniques and apparatuses may have utility in a testing environment that includes testing the computing device for solder joint reliability (SJR). The techniques and apparatuses may also have utility across a variety of field-use environments in which damage to the solder joints has an increased likelihood.

Figure 1:
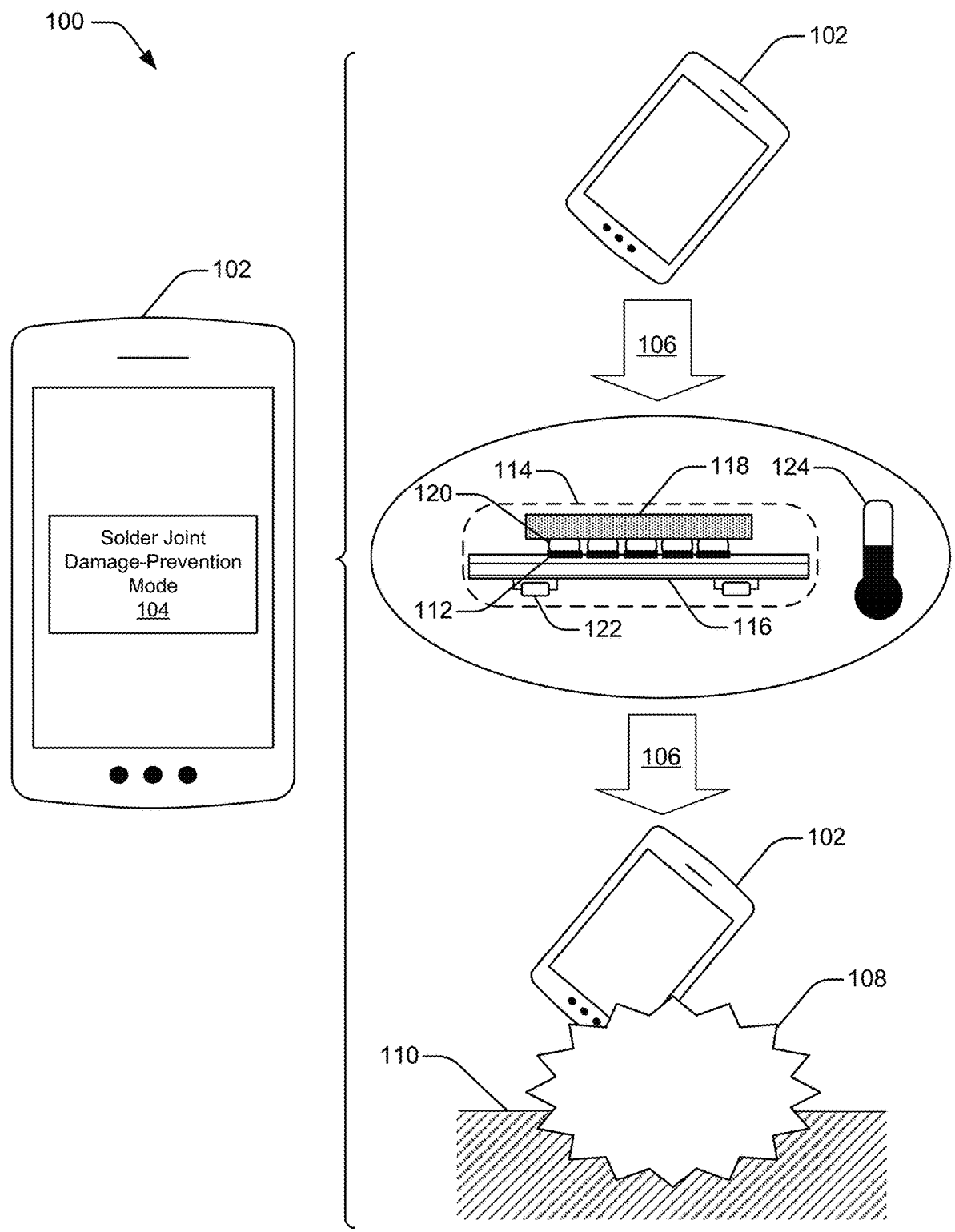
FIG. 1 illustrates example details of a computing device using a solder joint damage-prevention mode.

FIG. 1 illustrates example details 100 of a computing device 102 using a solder joint damage-prevention mode 104. Although FIG. 1 illustrates the computing device 102 as a smartphone, the computing device 102 may take a variety of forms, such as a navigation system within a jet aircraft, an instrumentation of a weather balloon, a droppable forest-service probe, a safety system for an automobile, a laptop, and so on.

Using the solder joint damage-prevention mode 104, the computing device 102 may identify a state 106 in or following which damage to solder joints of the computing device 102 has an increased likelihood. For instance, and as part of identifying the state 106, the computing device 102 determines that the computing device 102 is falling and expects to have an impact 108 with a surface 110 of the ground. Although FIG. 1 illustrates a type of the state 106 (e.g., a "falling-impact" state) in or following which damage to solder joints of the computing device 102 may be induced, other types of the state 106 are possible (e.g., a "temperature-cycle" state, an "extreme-temperature" state).

For example, the impact 108 may damage solder joints 112 of the computing device 102. The solder joints 112 may be part of a module 114 that includes a printed circuit board (PCB) 116 and an integrated circuit (IC) component 118 having interconnects 120. During fabrication, surface mount (SMT) techniques may form the solder joints 112 (e.g., fuse materials such as tin (Sn), silver (Ag), copper (Cu), lead (Pb), and so on), effectuating a coupling (e.g., a mechanical coupling and, in some instances, an electrical coupling) of the IC component 118 (e.g., the interconnects 120) to the PCB 116.

Although FIG. 1 illustrates the IC component 118 with the interconnects 120 as a ball grid array (BGA) package (e.g., a packaged IC die that uses an array of spherical balls for the interconnects 120), the IC component 118 with the interconnects 120 may be an IC die including copper pillars and/or studs (e.g., a flip-chip die), a lead-frame chip-scale package (LFCSP), a thin small-outline package (TSOP), and so on.

Upon identifying the state 106, the computing device 102 may activate a thermal-conditioning system 122 to change (e.g., increase) a temperature 124 of the solder joints 112. The change in the temperature may temporarily change a property of the solder joints 112 (e.g., an elasticity, a ductility) to prevent damage to the solder joints 112 that the impact 108 may induce.

As illustrated in FIG. 1, the thermal-conditioning system 122 may include a load resistor that is mounted to the PCB 116. For example, and as part of activating the thermal-conditioning system 122, the computing device 102 may route electrical current to the load resistor to generate heat. Further, a layout of the PCB 116 may locate the load resistor on a surface that is opposite to a surface to which the IC component 118 is coupled. In such an instance, the PCB 116 may include one or more vertical interconnect access structures (vias, not illustrated) to conduct heat (e.g., a conduction heat-transfer mechanism) from the thermal-conditioning system 122 (e.g., the load resistor), through the PCB 116, and to regions of the PCB 116 including the solder joints 112.

Alternatively or additionally, the thermal-conditioning system 122 may include logic circuitry (e.g., a processor, not illustrated) that executes extraneous computations (e.g., execute a looping algorithm of a nonessential application) or increases a clock frequency to generate heat. In such instances, one or more portions of the thermal-conditioning system 122 may be separate from the module 114 and transfer heat to the regions of the PCB 116, including the solder joints 112, using a combination of convection, radiation, and/or conduction heat-transfer mechanisms.

Figure 2:
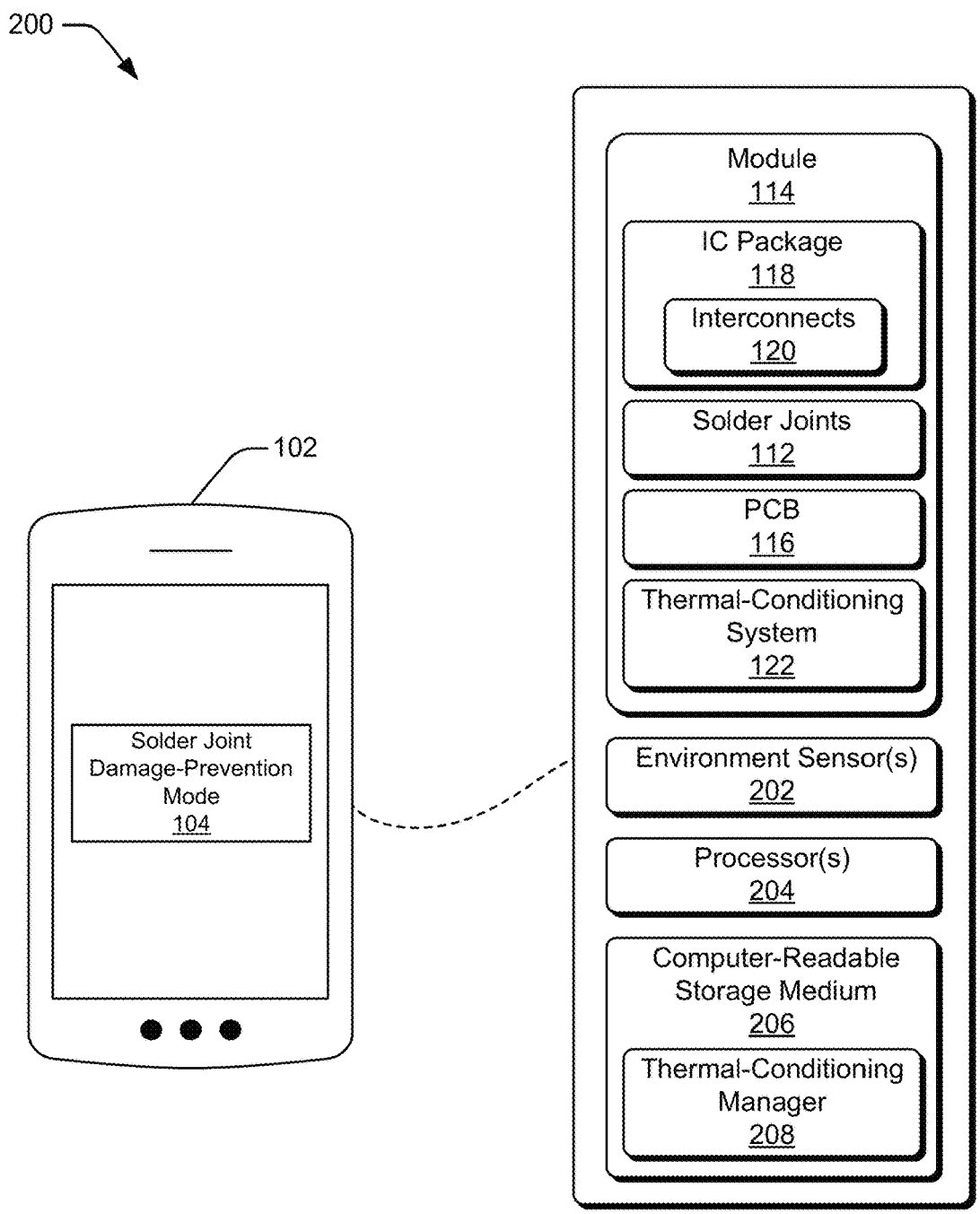
FIG. 2 illustrates example details of a computing device, including operative elements of the computing device that may implement a solder joint damage-prevention mode.

FIG. 2 illustrates example details 200 of the computing device 102, including operative elements of the computing device 102 that may implement the solder joint damage-prevention mode 104.

The computing device 102 includes the module 114. The module 114 may include the IC component 118 having the interconnects 120, the solder joints 112, and the PCB 116. The module 114 may also include one or more elements of the thermal-conditioning system 122 (e.g., a load resistor or other heat-generating device).

The computing device 102 also includes one or more environment sensor(s) 202 that can detect a change in an environment surrounding the computing device 102. Examples of the environment sensor(s) 202 include a thermistor that can detect a change in an ambient temperature, a barometer that can detect a change in an ambient barometric pressure, a global navigation satellite system (GNSS) receiver that can detect a change in a position, or an accelerometer that can detect a change in a velocity.

The computing device 102 also includes one or more processor(s) 204 and a computer-readable storage medium (CRM) 206. The processor(s) 204 may include a single-core processor or a multiple-core processor composed of a variety of materials, such as silicon, polysilicon, high-K dielectric, copper, and so on.

In the context of this discussion, the CRM 206 of the computing device 102 is a hardware-based storage medium, which does not include transitory signals or carrier waves. As an example, the CRM 206 may include one or more of a read-only memory (ROM), a Flash memory, a dynamic random-access memory (DRAM), a NOR memory, a static random-access memory (SRAM), and so on. The CRM 206 includes executable code or instructions of a thermal-conditioning manager application 208 that, when executed by the processor(s) 204 of the computing device 102, directs the operative elements of the computing device 102 to implement the solder joint damage-prevention mode 104.

Implementing the solder joint damage-prevention mode 104 may include a combination of activities, such as identifying the state 106 that may induce damage to the solder joints 112, activating the thermal-conditioning system 122 to change the temperature 124 of the solder joints 112 and improve a mechanical robustness of the solder joints 112, determining an absence of the state 106, and deactivating the thermal-conditioning system 122.

In some instances, implementing the solder joint damage-prevention mode 104 may include the computing device 102 identifying one or more activities that the computing device 102 needs to delay or offload while the computing device 102 is in the solder joint damage-prevention mode 104. Examples include delaying or offloading software updates that are not time-sensitive, memory and storage management processes, network communications that back up or receive data, and/or user data processing.

Implementing the solder joint damage-prevention mode 104 may also include scheduling operations. As examples, scheduling operations may include scheduling activation of the solder joint damage-prevention mode 104 based on a predicted time (e.g., a time that a jet aircraft is to depart), scheduling the delaying and/or offloading of activities of the computing device 102, and so on.

Figure 3:
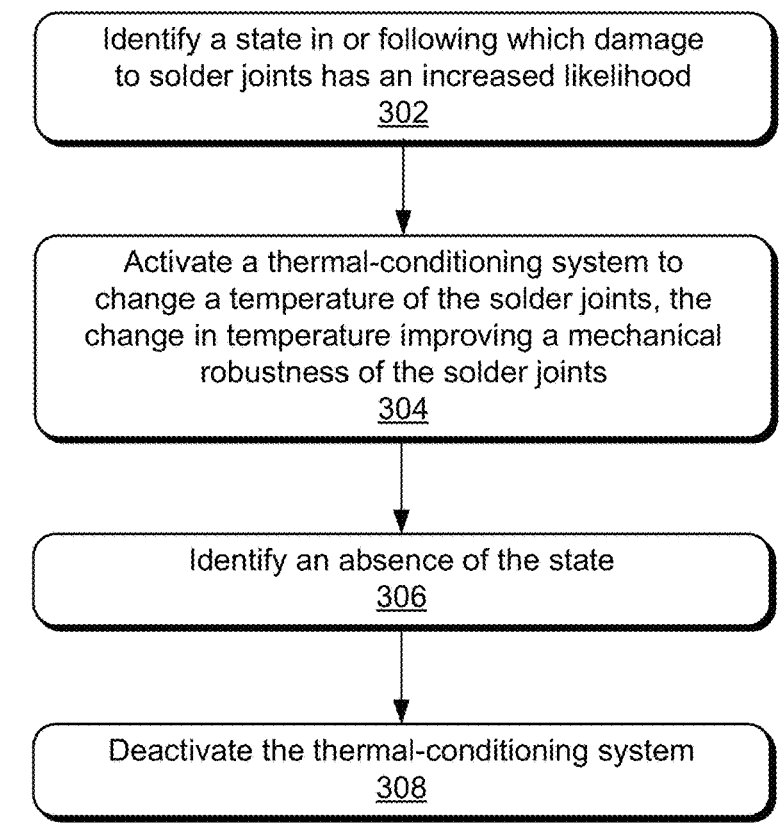
FIG. 3 illustrates an example method that may be performed by a computing device implementing a solder joint damage-prevention mode in accordance with one or more aspects.

FIG. 3 illustrates an example method 300 that may be performed by a computing device implementing a solder joint damage-prevention mode in accordance with one or more aspects. Operations of the method 300, described in a series of blocks 302-308, are not limited to the order or sequence as described below and, in general, may encompass various implementations of solder joint damage-prevention mode 104. Furthermore, the method 300 may use elements of FIG. 1 and FIG. 2.

At block 302, a computing device (e.g., the computing device 102) may identify a state (e.g., the state 106) in or following which damage to solder joints (e.g., the solder joints 112) of the computing device has an increased likelihood. In some instances, identifying the state may be in response to a user of the computing device providing an input to the computing device (e.g., the user manually enters the computing device into a solder joint damage-prevention mode through an options menu). In other instances, identifying the state may be in real time and in response to the computing device detecting a change in an environment surrounding the computing device (e.g., the computing device automatically enters into a solder joint damage-prevention mode in response to the environment sensors 202 detecting a change in an ambient temperature surrounding the computing device, a change in an ambient barometric pressure surrounding the computing device, a change in a position of the computing device, or a change in a velocity of the computing device). In yet other instances, identifying the state may include predicting the state at a future time.

At block 304, the computing device may activate a thermal-conditioning system (e.g., the thermal-conditioning system 122), effectuating a change in a temperature (e.g., the temperature 124) of the solder joints. Changing (e.g., increasing) the temperature of the solder joints may improve a mechanical robustness (e.g., ductility, elasticity) of the solder joints.

In some instances (e.g., when the user manually enters the computing device into a solder joint damage-prevention mode), activating the thermal-conditioning system may be in response to detecting a change in an environment surrounding the computing device. In other instances, activating the thermal-conditioning system may include activating the thermal-conditioning system at a predicted time.

Activating the thermal-conditioning system may include the computing device routing electrical current to one or more load resistors to generate heat. Alternatively or additionally, activating the thermal-conditioning system may include the computing device executing one or more processing algorithms that increase a clock frequency and/or perform extraneous computations to generate heat.

At block 306, the computing device may identify an absence of the state. In some instances, identifying the absence of the state may be in response to a user of the computing device providing an input to the computing device (e.g., the user manually removes the computing device from a solder joint damage-prevention mode through an options menu). In other instances, identifying the absence of the state may be in real time and in response to the computing device detecting a change in an environment surrounding the computing device (e.g., the computing device automatically exits the solder joint damage-prevention mode in response to the environment sensors 202 detecting a change in an ambient temperature surrounding the computing device, a change in an ambient barometric pressure surrounding the computing device, a change in a position of the computing device, or a change in a velocity of the computing device).

At block 308, the computing device may deactivate the thermal-conditioning system, effectuating another change in the temperature of the solder joints (e.g., a decrease in the temperature of the solder joints). In some instances, deactivating the thermal-conditioning system may be in response to the computing device identifying the absence of the state.

The preceding discussion describes techniques and apparatuses related to a solder joint damage-prevention mode for a computing device. These techniques may be realized using one or more of the entities or components shown in FIGS. 1-3, which may be further divided, combined, and so on. Thus, these figures illustrate some of the many possible systems or apparatuses capable of employing the described techniques.

What is claimed is:

1. A method comprising:
    detecting by a computing device, a first condition of the computing device, the first condition being a condition of the computing device or following which damage to solder joints of the computing device has an increased likelihood;
    activating, by the computing device in response to detecting the first condition, a thermal-conditioning system to effectuate a change in a temperature of the solder joints, the change in temperature improving a mechanical robustness of the solder joints, the activating of the thermal-conditioning system including routing electrical current to one or more load resistors of the computing device;
    detecting, by the computing device, a second condition of the computing device, the second condition being another condition in or following which the damage to solder joints of the computing device does not have the increased likelihood; and
    deactivating, by the computing device, the thermal-conditioning system to effectuate another change in the temperature of the solder joints.

2. The method as recited in claim 1, further comprising:
    receiving, by the computing device, user input, and
    wherein detecting the first condition of the computing device is performed in response to receiving the user input.

3. The method as recited in claim 1, wherein activating the thermal-conditioning system includes activating the thermal-conditioning system at a predicted time.

4. The method as recited in claim 1, wherein detecting the first condition comprises detecting a change in an environment surrounding the computing device.

5. The method as recited in claim 4, wherein detecting the change in the environment surrounding the computing device includes detecting a change in an ambient temperature, a change in an ambient barometric pressure, a change in a position, or a change in velocity.

6. The method as recited in claim 1, wherein detecting the first condition of the computing device occurs in real-time and is performed in response to detecting a change in an environment of the computing device.

7. The method as recited in claim 6, wherein detecting the change in the environment surrounding the computing device is based on detecting a change in an ambient temperature, a change in an ambient barometric pressure, a change in a position, or a change in a velocity.

8. The method as recited in claim 1, wherein activating the thermal-conditioning system further comprises executing one or more processing algorithms that increase a clock frequency and/or perform extraneous computations.

9. A computing device comprising:
    a module comprising:
        a printed circuit board;
        an integrated circuit component having interconnects; and
        a thermal-conditioning system;
    a processor operably coupled to the module of the computing device; and
    a computer-readable storage medium, the computer-readable storage medium including a thermal-conditioning manager that, upon execution by the processor, directs the computing device to:
        detect a first condition of the computing device, the first condition being a condition of the computing device in or following which damage to solder joints of the computing device has an increased likelihood, the solder joints coupling the interconnects of the integrated circuit component with the printed circuit board;
        activate the thermal-conditioning system to effectuate a change in a temperature of the solder joints, the change in temperature improving a mechanical robustness of the solder joints, the activation of the thermal-conditioning system including routing electrical current to one or more load resistors of the computing device;
        detect a second condition of the computing device, the second condition being another condition in or following which the damage to solder joints of the computing device does not have the increased likelihood; and
        deactivate the thermal-conditioning system to effectuate another change in the temperature of the solder joints.

10. The computing device of claim 9, wherein the thermal-conditioning manager further directs the computing device to:
    receive user input, and
    wherein the computing device detects the first condition of the computing device in response to receiving the user input.

11. The computing device of claim 9, wherein the thermal-conditioning manager further directs the computing device to activate the thermal-conditioning system at a predicted time.

12. The computing device of claim 9, wherein detection of the first condition comprises detection of a change in an environment surrounding the computing device.

13. The computing device of claim 12, wherein detecting the change in the environment surrounding the computing device includes detecting a change in an ambient temperature, a change in an ambient barometric pressure, a change in a position, or a change in velocity.

* * * * *